(12) United States Patent
Zhou et al.

(10) Patent No.: US 8,431,033 B2
(45) Date of Patent: Apr. 30, 2013

(54) HIGH DENSITY PLASMA ETCHBACK PROCESS FOR ADVANCED METALLIZATION APPLICATIONS

(75) Inventors: Chunming Zhou, Milipitas, CA (US); Liqi Wu, Santa Clara, CA (US); Karthik Colinjivadi, San Jose, CA (US); Emery Kuo, Sunnyvale, CA (US); Huatan Qiu, Dublin, CA (US); KieJin Park, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 154 days.

(21) Appl. No.: 12/974,630

(22) Filed: Dec. 21, 2010

(65) Prior Publication Data

US 2012/0152896 A1 Jun. 21, 2012

(51) Int. Cl.
*C03C 15/00* (2006.01)
(52) U.S. Cl.
USPC ......... 216/41; 427/571; 118/722; 118/723 R; 118/723 MP; 204/192.17; 204/298.09
(58) Field of Classification Search .................. 427/571; 118/722; 204/192.17, 298.09; 216/41
See application file for complete search history.

(56) References Cited

U.S. PATENT DOCUMENTS

| | | | | |
|---|---|---|---|---|
| 6,217,721 | B1 * | 4/2001 | Xu et al. | 204/192.17 |
| 6,853,141 | B2 * | 2/2005 | Hoffman et al. | 315/111.21 |
| 7,897,516 | B1 * | 3/2011 | Kinder et al. | 438/695 |
| 8,062,484 | B2 * | 11/2011 | Brown et al. | 204/192.17 |
| 2004/0211661 | A1 * | 10/2004 | Zhang et al. | 204/192.12 |

OTHER PUBLICATIONS

S. Wolf et al. Silicon Processing for the VLSI Era, vol. 1, (1986) Lattice Press, pp. 353-362.*

* cited by examiner

*Primary Examiner* — Lan Vinh
*Assistant Examiner* — Maki Angadi

(57) ABSTRACT

A physical vapor deposition (PVD) system and method includes a chamber including a target and a pedestal supporting a substrate. A target bias device supplies DC power to the target during etching of the substrate. The DC power is greater than or equal to 8 kW. A magnetic field generating device, including electromagnetic coils and/or permanent magnets, creates a magnetic field in a chamber of the PVD system during etching of the substrate. A radio frequency (RF) bias device supplies an RF bias to the pedestal during etching of the substrate. The RF bias is less than or equal to 120V at a predetermined frequency. A magnetic field produced in the target is at least 100 Gauss inside of the target.

18 Claims, 9 Drawing Sheets

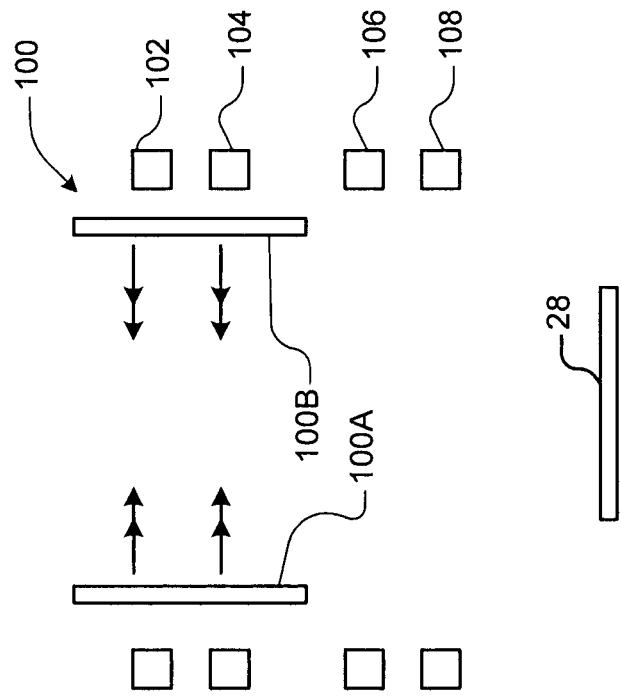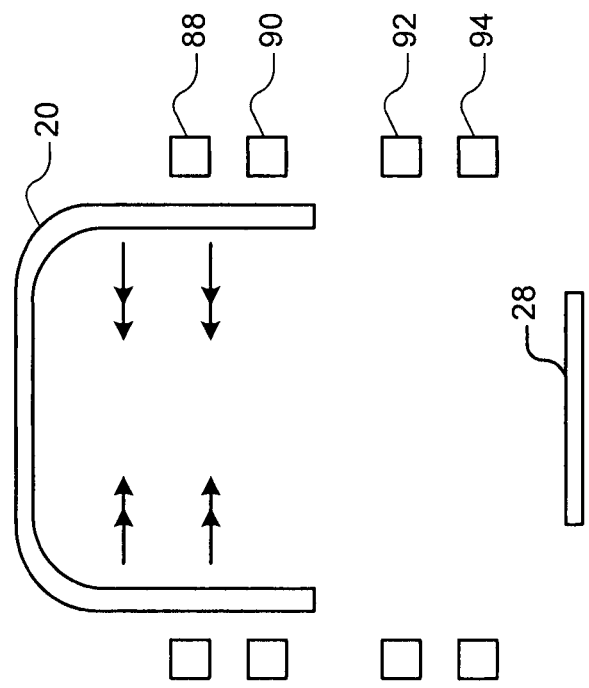

HIGH DENSITY PLASMA ETCHBACK PROCESS FOR ADVANCED METALLIZATION APPLICATIONS

FIELD

The present disclosure relates to physical vapor deposition (PVD) systems, and more particularly to etchback processes for PVD systems.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Manufacturing of semiconductor devices typically involves deposition of electrically conductive material on substrates such as semiconductor wafers. Physical vapor deposition ("PVD") systems may be used to deposit metal layers on the substrate and/or to etch an exposed surface of the substrate.

The metal layers can be used as diffusion barriers, adhesion or seed layers, primary conductors, antireflection coatings, etch stops, etc. In some cases, the conductive material may be deposited by electroplating onto a seed layer of metal such as copper located in vias or trenches.

In PVD systems, plasma feed gas such as Argon is introduced into a chamber. Electrons collide with atoms of the plasma feed gas to create ions. Magnetic fields are used to increase a residence time of the electrons by causing the electrons to spiral through the plasma. As a result, ionization levels of the plasma feed gas also increase.

A negative potential applied to a cathode attracts the ions towards a target. The ions collide with the target. Target atoms are dislodged from the surface of the target by direct momentum transfer. The dislodged atoms and ions are then deposited on a substrate or used to etch the substrate.

The rates of etching or deposition can be adjusted by varying power applied to the target and an RF bias applied to the substrate. When the etch/deposition ratio is 1, no net deposition or etching is performed. When the E/D ratio is less than 1, net deposition occurs. When the E/D ratio greater than 1, net etching occurs.

Damascene processing may be used to form interconnections for integrated circuits (ICs). In a typical Damascene process, a pattern of trenches and/or vias is etched in a dielectric layer of a substrate. A thin layer of diffusion-barrier film is then deposited onto the dielectric layer. The diffusion barrier film may include a material such as tantalum (Ta), tantalum nitride (TaN), a TaN/Ta bilayer, or other suitable materials.

A seed layer of copper is deposited on the diffusion-barrier layer using PVD, CVD or another process. Afterwards, the trenches and vias are electroplated with copper. Finally, the surface of the wafer may be planarized to remove excess copper.

An etchback process may be used when creating the barrier/seed layer to improve the step coverage and/or barrier/seed layer performance. For example, etchback is used when depositing the diffusion barrier layer (such as TaN/Ta bilayer) to reduce the thickness of the barrier layer at the bottom of a dual damascene via. The reduced bottom coverage tends to reduce via resistance ($R_c$), improve distribution of the via resistance $R_c$ and increase the resistance to electromigration.

There are several disadvantages associated with using the etchback process. Dielectric damage such as trench bottom roughening and microtrenching may occur. If a sloped surface exists in the structure (for example, a sloped surface in logic via chain structures), a higher resputtering yield at the sloped surface may cause little or no coverage or may even damage the dielectric (particularly at the sloped surface area).

Ultra-low k dielectric typically used for advanced nodes tends to be more susceptible to damage during the etchback process. Low plasma density (corresponding to high energetic ions under a particular RF bias power) typically used for etchback is responsible for the damage of the dielectric. One way to reduce the risk of dielectric damage is to lower the RF bias power. However, even with a low RF bias power, the energy of ions can still be high. Under the low density plasma conditions, the amount of ions available for etching is limited. Therefore, the risk of dielectric damage is still relatively high. Further lowering the RF bias will further reduce the resputter etch rate so the etch to deposition (E/D) ratio may be reduced to an unacceptable level for etching applications.

Furthermore, there are other disadvantages when using low E/D ratio etchback processes. The deposition component increases significantly and tends to cause overhang growth during the etchback process. The dielectric damage and increased overhang tends to adversely impact device yield and reliability.

SUMMARY

A method includes supplying DC power to a target in a physical vapor deposition (PVD) system, wherein the DC power is greater than or equal to 8 kW; creating a magnetic field in a chamber of the PVD system; setting a radio frequency (RF) bias applied to a pedestal supporting a substrate to be less than or equal to 120V at a predetermined frequency; and etching the substrate.

In other features, creating the magnetic field includes: arranging N electromagnetic coils (EM) around the target; arranging P EM coils below the target, wherein N and P are integers greater than or equal to 1; and producing a magnetic field in the target that is at least 100 Gauss inside of the target. The N EM coils produce a magnetic field that is opposite in polarity to a magnetic field produced by the P EM coils.

In other features, the magnetic field is created by permanent magnets arranged around and below the target. The predetermined frequency is 13.65 MHz. The N EM coils and the P EM coils create a magnetic cusp.

In other features, the permanent magnets create a magnetic cusp. The DC power is greater than or equal to 10 kW. An etch to deposition (E/D) ratio during etching is greater than or equal to 2. The E/D ratio during etching is greater than or equal to 3. The RF bias is less than 100 V at the predetermined frequency.

In other features, the etching of the substrate includes etching a seed layer arranged on the substrate. The seed layer is arranged in at least one of a via and a trench. The etching of the substrate includes etching a diffusion barrier layer arranged on the substrate. The diffusion barrier layer is arranged in at least one of a via and a trench.

In other features, the target is dome shaped, cylinder shaped, or cone frustum shaped.

A physical vapor deposition (PVD) system includes a chamber including a target and a pedestal supporting a substrate. A target bias device supplies DC power to the target during etching of the substrate. The DC power is greater than or equal to 8 kW. A magnetic field generating device creates a magnetic field in a chamber of the PVD system during etching of the substrate. A radio frequency (RF) bias device generates an RF bias at the pedestal during etching of the substrate. The RF bias is less than or equal to 120V at a predetermined frequency.

In other features, the magnetic field generating device includes N electromagnetic coils (EM) arranged around the target, and P EM coils arranged below the target. N and P are integers greater than or equal to 1. A magnetic field produced in the target is at least 100 Gauss inside of the target. The N EM coils produce a magnetic field that is opposite in polarity to a magnetic field produced by the P EM coils. The N EM coils and the P EM coils create a magnetic cusp.

In other features, the magnetic field generating device includes permanent magnets arranged around and below the target. The predetermined frequency is 13.65 MHz. The permanent magnets create a magnetic cusp.

In other features, the DC power is greater than or equal to 10 kW. An etch to deposition (E/D) ratio during etching is greater than or equal to 2. The E/D ratio during etching is greater than or equal to 3. The RF bias is less than 100 V at the predetermined frequency.

In other features, a seed layer of the substrate is etched. The seed layer is arranged in at least one of a via and a trench. A diffusion barrier layer of the substrate is etched. The diffusion barrier layer is arranged in at least one of a via and a trench.

In other features, the target is dome shaped, cylinder shaped, or cone frustum shaped.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIGS. 1B-1D are simplified cross-sectional views of other example arrangements of targets and magnetic field generating devices;

DESCRIPTION

Figure 1A:
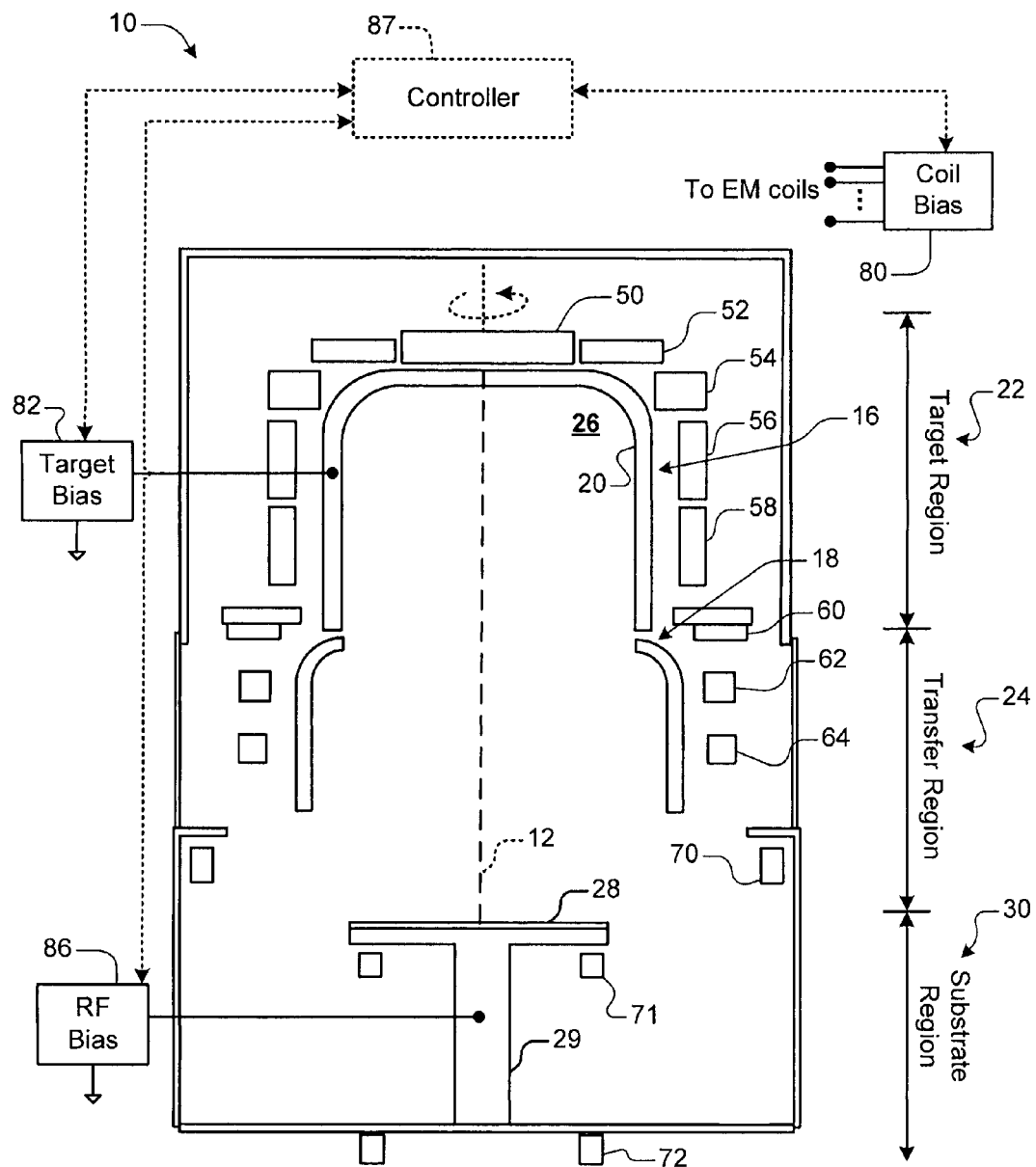
FIG. 1A is a simplified cross-sectional view of an example of a physical vapor deposition (PVD) system according to the present disclosure.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

The present disclosure describes a high density plasma etchback process with characteristics of low wafer bias and a high etch to deposition (E/D) ratio. The high density plasma etchback process according to the present disclosure tends to significantly reduce dielectric damage and the overhang that may occur with other etchback processes. For example only, the barrier layer may include a TaN/Ta barrier layer for copper barrier layer/seed layer applications, although other materials may be used.

Referring now to FIG. 1A, an exemplary PVD system 10 is shown. As can be appreciated, while PVD system 10 is shown to include a Hollow Cathode Magnetron (HCM) target in FIG. 1A, the present disclosure applies to PVD systems using other types of targets. The PVD system is generally symmetric about a central axis 12 and typically includes a cathode 16 and an anode 18.

The cathode 16 also includes a target 20, which provides material to be deposited onto a substrate 28, which may be supported by a pedestal 29. For example only, the target 20 can be made of aluminum, tantalum, titanium, copper or other suitable target materials. For HCM applications, the cathode 16 and target 20 may have a hollow non-planar shape as shown, although other arrangements are contemplated.

Plasma is generated in the PVD system 10 by introducing a plasma feed gas, such as Argon, into a container portion 26 of the cathode 16. For example only, a negative bias is applied to the cathode 16 while holding the chamber at ground potential. For example only, a voltage supply (not shown) may supply a negative DC voltage across the cathode target 20 and an adapter ring (not shown). The adapter ring and the chamber may be connected to chassis ground or another reference potential. The anode 18 is typically allowed to float. In other words, the anode 18 is neither grounded nor biased, although in some cases the anode can be biased to a positive electrical bias relative to the cathode. As a result, an electric field is generated across the plasma feed gas. For example only, the negative bias may be on the order of −100 VDC to −600 VDC, although other bias voltages may be used.

The negative bias on the cathode 16 accelerates positive ions of the formed plasma towards the target 20 to sputter atoms from the target 20 in a target region 22. The sputtered atoms may or may not become ionized, and a subset of them subsequently travels through a transfer region 24 and onto substrate 28 arranged in a substrate region 30.

One or more permanent magnets 50 may be rotated relative to the central axis 12 to provide a rotating magnetic field in the target region of the chamber. Electromagnetic coils may also be used to control the magnetic field at various points of the chamber. Since the substrate 28 is usually a circular wafer, concentric electromagnetic coils may be used.

In FIG. 1A, one or more electromagnetic coils 52, 54, 56 and 58 are arranged in the target region 22 to control the magnetic field in the target region 22. While EM coils are shown, permanent magnets or a combination of EM coils and permanent magnets may also be used. Similarly, one or more electromagnetic coils 60, 62 and 64 are arranged in the transfer region 24 to control the magnetic field in the transfer region 24. Likewise, one or more electromagnetic coils 70, 71 and 72 are arranged in the substrate region 30 to control the magnetic field in the substrate region 30.

A coil bias device 80 may be used to adjust bias current supplied to the EM coils 52-72. The coil bias device 80 may supply the same or different current levels and/or polarities to each of the EM coils 52-72. A target bias device 82 may be used to provide DC power to the target 20. An RF bias device 86 may be used to supply an RF bias to the pedestal 29. The target bias device 82, the RF bias device 86 and/or the coil bias device 80 can be set manually. Alternately, a controller 87 may communicate with the target bias device 82, the RF bias device 86 and/or the coil bias device 80 to automatically monitor and control the etching process, as will be described further below.

Figure 1D:
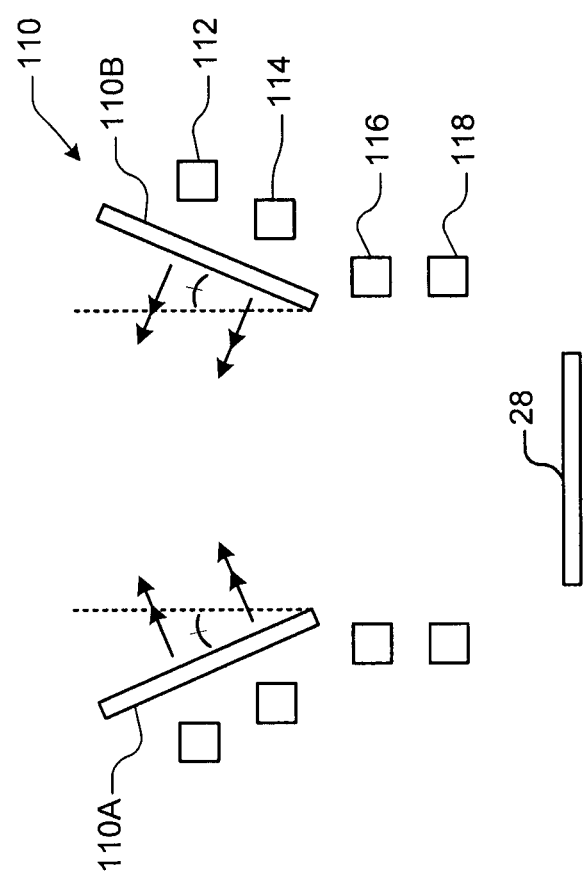

Referring now to FIGS. 1B-1D, other target arrangements may be used. For example in FIG. 1B, the HCM target 20 is used with permanent magnets 88, 90, 92 and 94. In FIG. 1C, a cylindrical target 100 includes walls 100A and 100B. Permanent magnets or EM coils 102, 104, 106 and 108 may be used. In FIG. 1D, a cone frustum-shaped target 110 includes walls 110A and 110B forming an angle relative to a line perpendicular to a surface of the substrate 28. A first portion of the target 110 is wider than a second portion, which is closer to the substrate 28.

In FIGS. 1A-1C, erosion occurs on sidewalls of the target with emission flux travelling generally parallel to a surface of the substrate 28 to be etched. In FIG. 1D, emission flux travels away from the substrate 28. In contrast, emission flux from a planar target generally has emission flux that travels perpendicular towards the surface of the substrate 28 to be etched. Still other target shapes and magnet/EM coil arrangements are contemplated.

Figure 2:
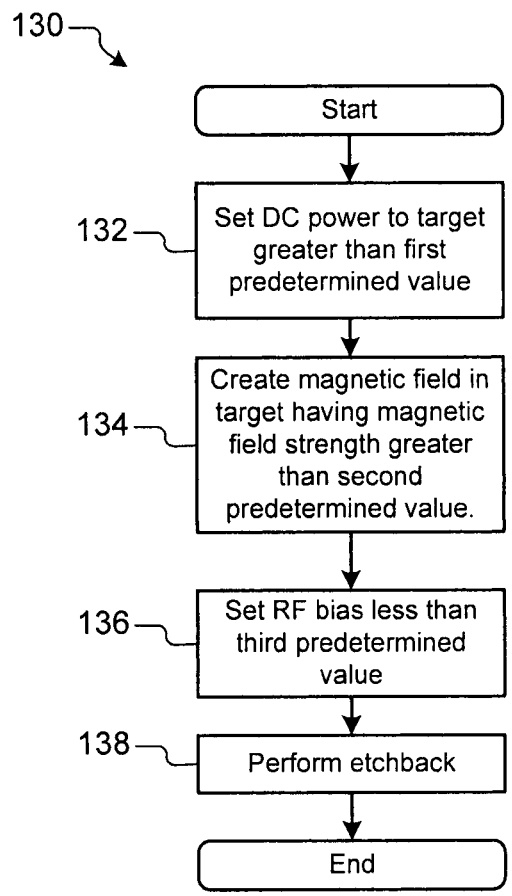
FIG. 2 is an example of a flowchart depicting a method for etching according to the present disclosure

Referring now to FIG. 2, an example of flowchart depicting an etchback process according to the present disclosure is shown. High density plasma is used during the etchback process. Instead of relying on high energetic ions with low plasma density to sputter barrier material from the surface, relatively low energy ions with high density are used to sputter the barrier material.

By reducing the ion energy, the dielectric damage is minimized. Furthermore, the E/D ratio is kept at a sufficiently high level. The E/D ratio is relatively high due to a large number of ions that are available for sputtering. The high E/D ratio limits deposition and tends to prevent overhang growth during the etchback process.

According to the present disclosure, electron/ion production is increased by increasing DC power applied to the target above a first predetermined value. In addition, the magnetic field strength in the target region is increased above a second predetermined value to increase electron confinement. Therefore, the overall ExB fields are increased to a level in the target volume such that the RF bias applied to the substrate can be reduced below a third predetermined value for etching applications.

Increasing the electron/ion production can be achieved by increasing the DC power applied to the target. The DC power is increased above levels that are normally used during the etchback process (typically 1-6 kW) in PVD systems. According to the present disclosure, the DC power is increased above the first predetermined value. For example only, the first predetermined value may be 8 kW. In another example, the first predetermined value may be 10 kW. In still another example, the first predetermined value may be between 10 kW and 20 kW.

As set forth above, conventional PVD etchback processes typically set DC power between 1-6 kW. The DC power is usually limited because the deposition rate is too high at higher DC power levels. This reduces the E/D ratio significantly. When the E/D ratio is less than 1, it is unsuitable for etching applications.

Referring back to FIG. 2, an example method 130 according to the present disclosure is shown. Initially, plasma is created in the chamber. At 132, the DC power to the target is set to a value that is greater than or equal to the first predetermined value. At 134, the magnetic field is adjusted to have a magnetic cusp around the target lip to define the erosion region of a target to the sidewall and to confine the plasma within the target volume. The magnetic field strength, when greater than the second predetermined value, further increases the percentage ionization of the plasma to form a highly ionized plasma. At 136, the RF bias to the pedestal is set less than the third predetermined value. At 138, etchback of the substrate is performed.

In one example, the second predetermined value is greater than or equal to 100 Gauss. In another example, the second predetermined value is greater than or equal to 200 Gauss, although other values may be used. For example only, the magnetic field strength inside the target may vary between 100 Gauss and 500 Gauss.

In one example, the magnetic cusp and magnetic field is created by EM coils. In another example, the magnetic cusp and magnetic field are created by permanent magnets. In yet another example, the magnetic cusp and magnetic field are created by the combinations of EM coils and permanent magnets.

In one example, the third predetermined value is less than or equal to 120 V at a first predetermined frequency. In another example, the third predetermined value is less than or equal to 110 V at the first predetermined frequency. In another example, the third predetermined value is less than or equal to 100 V at the first predetermined frequency. In another example, the third predetermined value is less than or equal to 90 V at the first predetermined frequency. For example, the first predetermined frequency can be 13.65 MHz, although other frequencies can be used.

Figure 3:
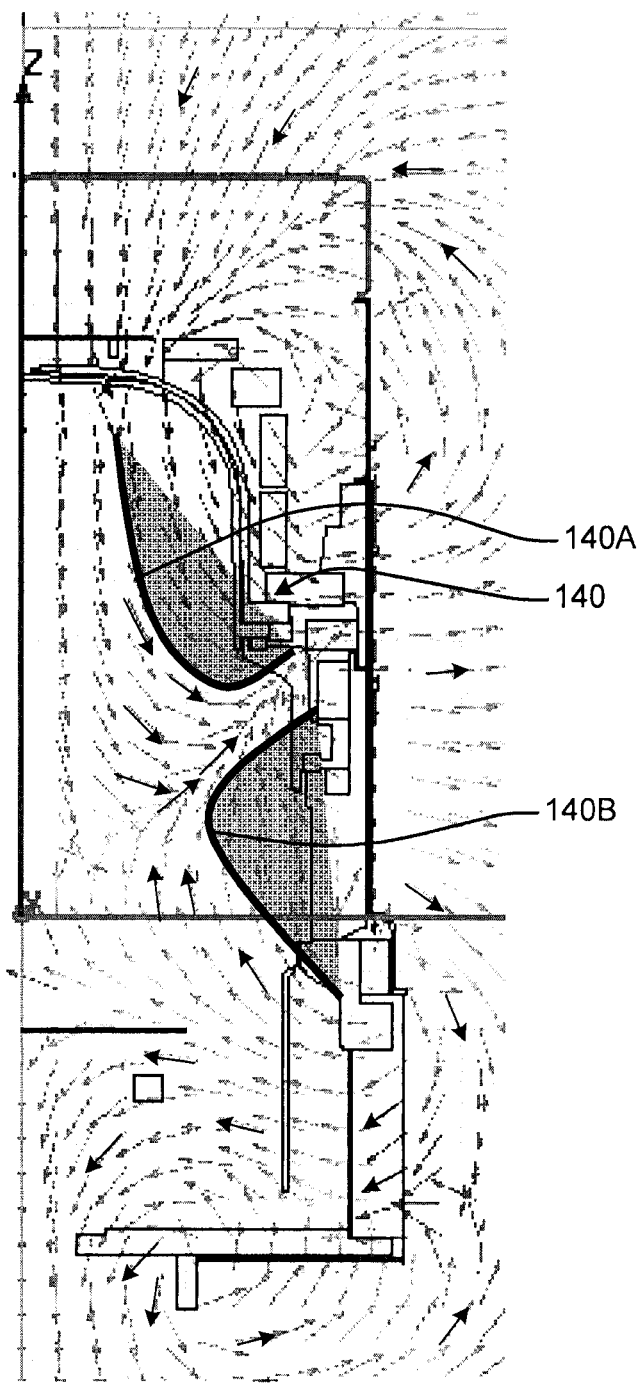
FIG. 3 is a simulated field vector plot.

Referring now to FIG. 3, a simulated field vector plot is shown. A magnetic cusp 140A and 140B (collectively magnetic cusp 140) is created near an opening of the target using the electromagnetic (EM) coils arranged around the target. The magnetic field strength inside the target is greater than 100 Gauss and ranges from 100 Gauss to over 500 Gauss.

The magnetic cusp 140 helps to confine the plasma within the source. Improved confinement tends to occur as the magnetic cusp 140 moves closer to a lip of the target. Higher plasma density tends to occur with improved confinement.

The magnetic strength of the etchback process has been increased significantly relative to conventional processes to provide stronger confinement of electrons within the source. The magnetic field strength is greater than approximately 100 Gauss across the target volume and approximately 500 Gauss at a dome area of the target. The resulting magnetic field strength is significantly higher than conventional processes, which are generally less than 100 Gauss inside of the target.

Figure 4:
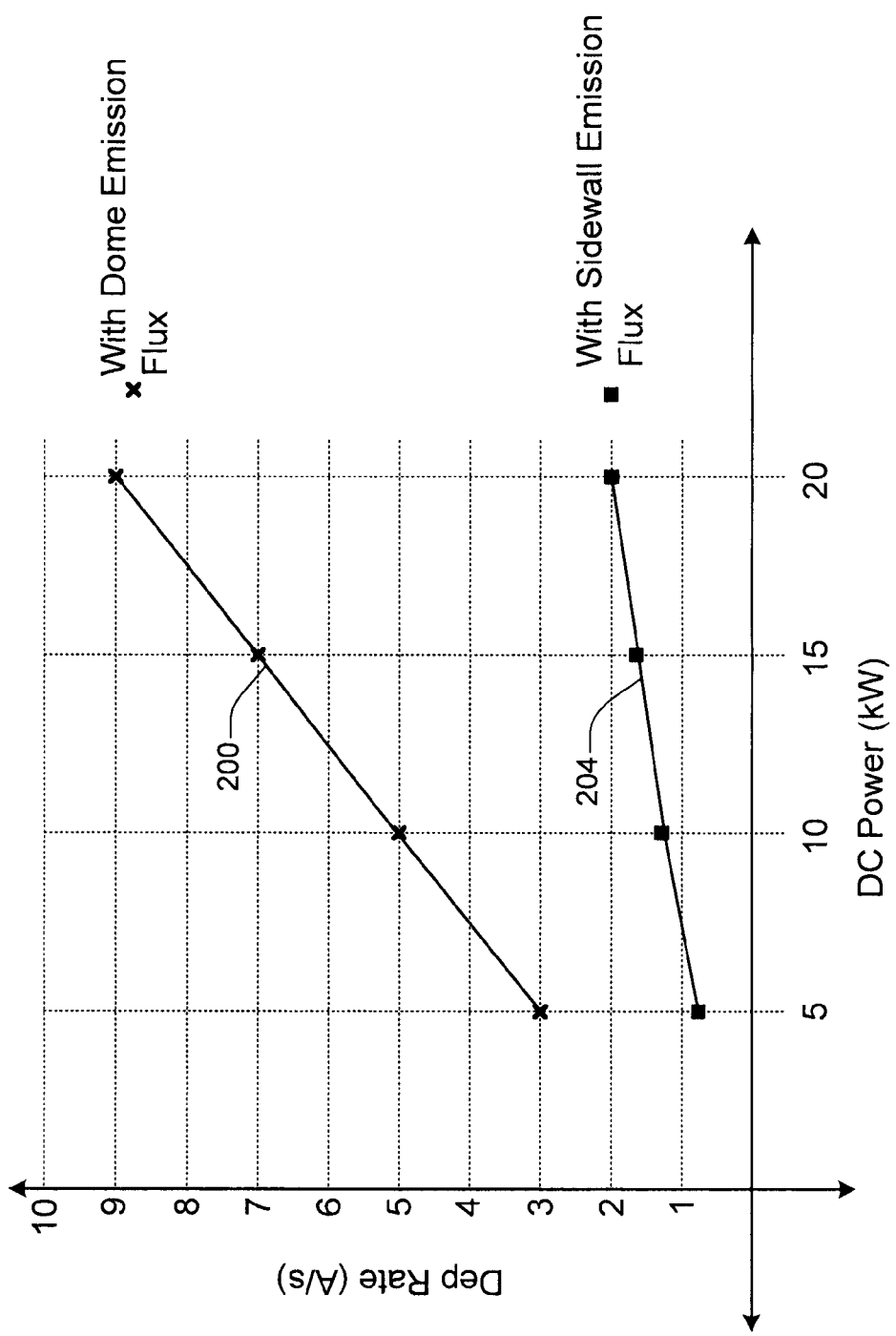
FIG. 4 is a graph showing deposition rate as a function of DC power during etching with different source fluxes.

Referring now to FIG. 4, a graph showing deposition rate as a function of DC power during etching is shown. For a conventional dome erosion process (which is similar to a process with a flat target), the deposition rate increases at a faster rate (indicated by a steeper curve) as DC power increases as shown at 200 in FIG. 4. The substrate has direct view of the emission flux from the dome erosion area of the target. Using the etchback process described herein, the target 20 has magnetically defined sidewall erosion that is similar to a process with a cylinder shaped target. As a result, most of the emission flux travels laterally within the source, which limits the amount of metal species travelling towards the wafer surface. This tendency helps to limit the deposition rate as the DC power increases, which is shown at 204 in FIG. 4. There is small change in deposition rate as DC power increases. This makes high DC power feasible for etching applications as described herein.

The sidewall erosion also generates lateral flux. The species are forced to oscillate within the HCM source, which increases ionization and the ion density available for etching. This facilitates high plasma density for etching applications.

Figure 5A:
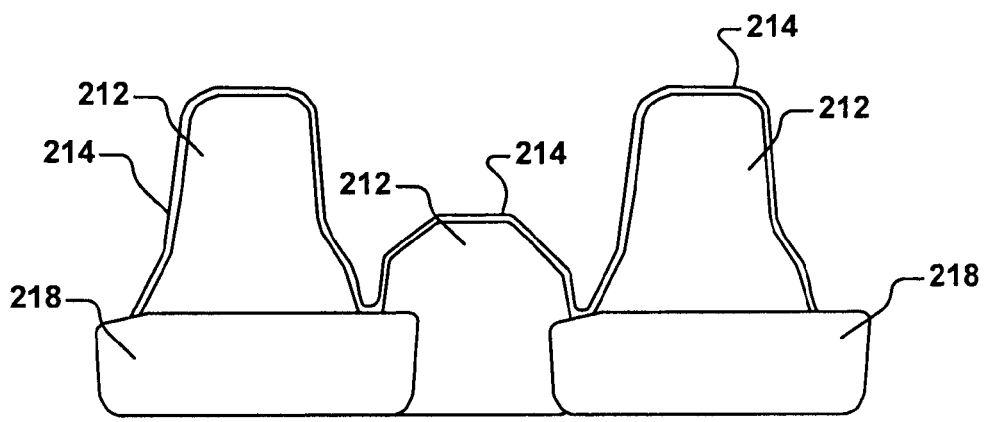
FIGS. 5A-5C are cross-sections illustrating as deposited film, the deposited film after etchback with a conventional process and the deposited film after etchback according to the present disclosure, respectively.
Figure 5B:
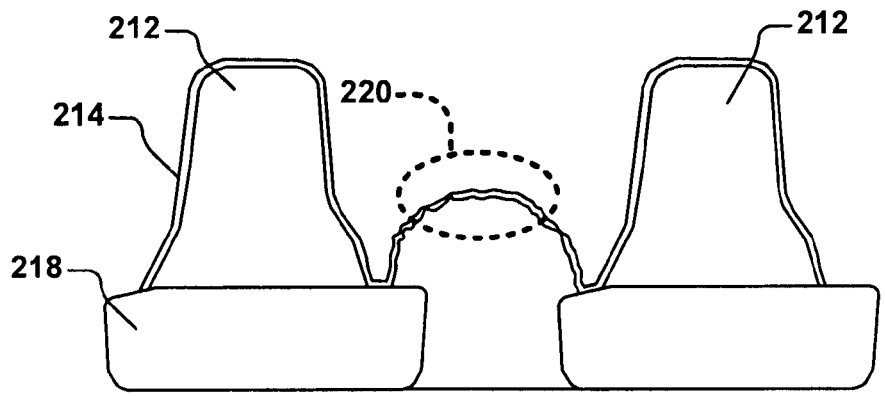
Figure 5C:
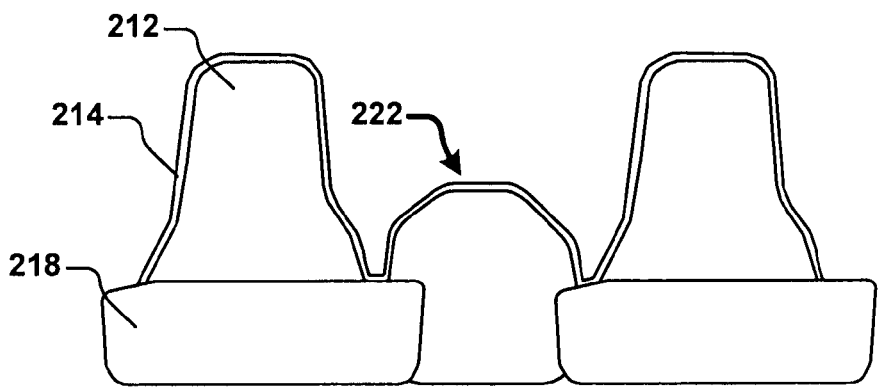

Referring now to FIGS. 5A-5C, first, second and third cross-sections illustrate as deposited film, the deposited film after etchback with a conventional etchback process and the deposited film after etchback according to the present disclosure, respectively. The high density plasma etching process tends to avoid dielectric damage and reduces the overhang for barrier applications (such as TaN). In FIG. 5A, dielectric 212 is formed over copper region 218 and between adjacent copper regions 218. A barrier film 214 is deposited on the dielectric 212. For example, the barrier film 214 may have a thickness of 200 Angstroms.

In FIG. 5B, damage occurs at 220 after a 100 Angstrom conventional etchback process. The conventional high bias etchback process causes dielectric damage and bottom roughening. In FIG. 5C, little or no damage occurs at 222 after a 100 Angstrom etchback using the high density plasma etching process according to the present disclosure.

Figure 6A:
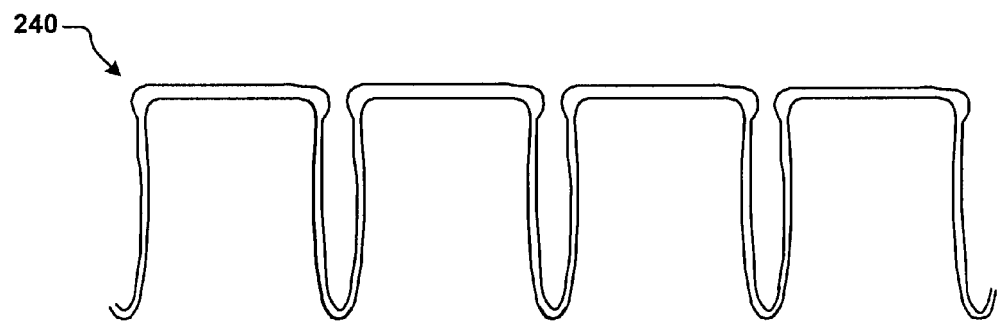
FIGS. 6A-6B are cross-sections illustrating etchback of the deposited film with first and second E/D ratios, respectively.
Figure 6B:
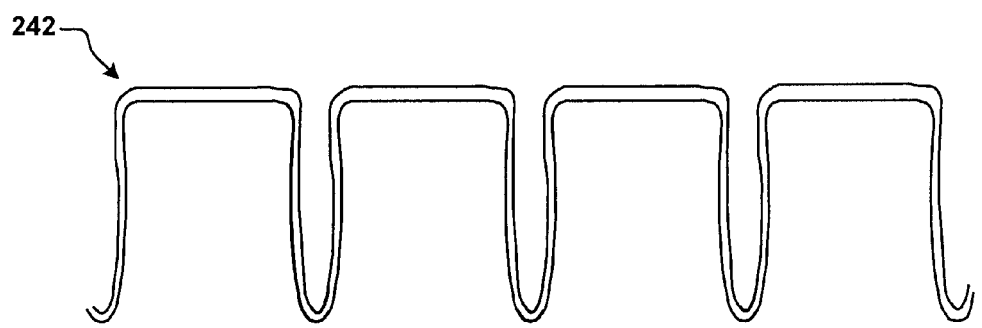

Referring now to FIGS. 6A-6B, cross-sections illustrating etchback of the deposited film with first and second E/D ratios, respectively, are shown. The cross-sectional views in FIGS. 6A-6B show the E/D ratios of 2 and 5, respectively. In FIG. 6A, a significant overhang 240 is developed due to a deposition component of the relatively low E/D ratio of 2. When using the higher E/D ratio of 5 in FIG. 6B, an overhang 242 is minimized across all the trenches with the size varying from approximately 30 nm to 60 nm.

Referring back to the example shown in FIG. 3, the magnetic cusp 140 is located close to the HCM target lip and is created by the EM coils 50-64, which help to confine plasma within the HCM source volume. The magnetic field is significantly enhanced by operating the EM coils 50-64 at relatively high current, which increases the electron confinement and improves ion density.

The relatively high DC power applied to the target significantly increases the plasma density. The deposition component is limited by focusing erosion on the sidewalls of the HCM source so that the amount of species that can reach wafer surface is limited at a low level (such as less than <1 A/s). The laterally emitted species oscillate within the HCM source, which further increases the density of plasma.

Due to the high plasma density, the wafer RF bias may be reduced, which helps to avoid dielectric damage during the etchback process. In some examples, the E/D ratio may be maintained at a relative high level (e.g., E/D≧3), which helps to limit the overhang growth and makes it suitable for advanced node applications.

Referring back to FIGS. 1A and 3, the magnetic cusp may be formed in some examples by reversing the polarity of some of the EM coils relative to others of the EM coils (assuming that all of the EM coils have the same polarity configuration). For example in FIGS. 1A and 3, the EM coils 52, 54, 56, 58 and 72 may have a first magnetic polarity and the EM coils 62, 64 and 70 may have a second magnetic polarity that is opposite to the first magnetic polarity. The magnitude of the current for the EM coils 52, 54, 56 and 58 may be decreasing. For example only, the EM coil 52 may be driven by approximately 12 Amps (A), the EM coil 54 may be driven by approximately 8.63 A, the EM coil 56 may be driven by approximately 7.56 A and the EM coil 58 may be driven by approximately 5.68 A. The EM coils 62, 64 and 70 may be driven by approximately −5.4 A, 0 A and −1.05 A respectively, (assuming all of the EM coils have the same polarity configuration). The EM coils 60 and 71 may be driven by approximately 0 A. Using these values and general arrangement of EM coils will create the magnetic cusp 140, although other coil arrangements and/or current values may be used.

The relative magnetic field strength generated by the EM coils determines the position and shape of the magnetic cusp 140. When the net magnetic fields of the two groups of EM coils are same, the magnetic cusp 140 will be in the middle of the EM coils with opposite polarity and symmetrical. When one side has a higher EM field than the other (as in the example set forth above), the magnetic cusp will be skewed towards the weaker side. As can be appreciated, other EM coil arrangements and current magnitudes can be used.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. At least one of before or after the etchback process described herein, one or more lithographic patterning tools and/or processes may be used.

Lithographic patterning of a film typically comprises some or all of the following steps, each step enabled with a number of possible tools: (1) application of photoresist on a substrate, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or substrate by using a dry or plasma-assisted etching tool; and (6) removing the resist using a tool such as an RF or microwave plasma resist stripper.

Another aspect of the disclosure is an apparatus configured to accomplish the methods described herein. A suitable apparatus includes hardware for accomplishing the process operations and a controller having instructions for controlling process operations in accordance with the present disclosure. The controller may have interfaces that communicate with the target bias device, the RF bias device, and/or the magnetic field generating device so that the process can be automated. Additionally, one or more sensors such as temperature, pressure, and/or other types of sensors may be used.

The controller will typically include one or more memory devices and one or more processors configured to execute the instructions so that the apparatus will perform a method in accordance with the present disclosure. Tangible machine-readable media containing instructions for controlling process operations in accordance with the present disclosure may be coupled to or may be part of the controller.

Figure 7:
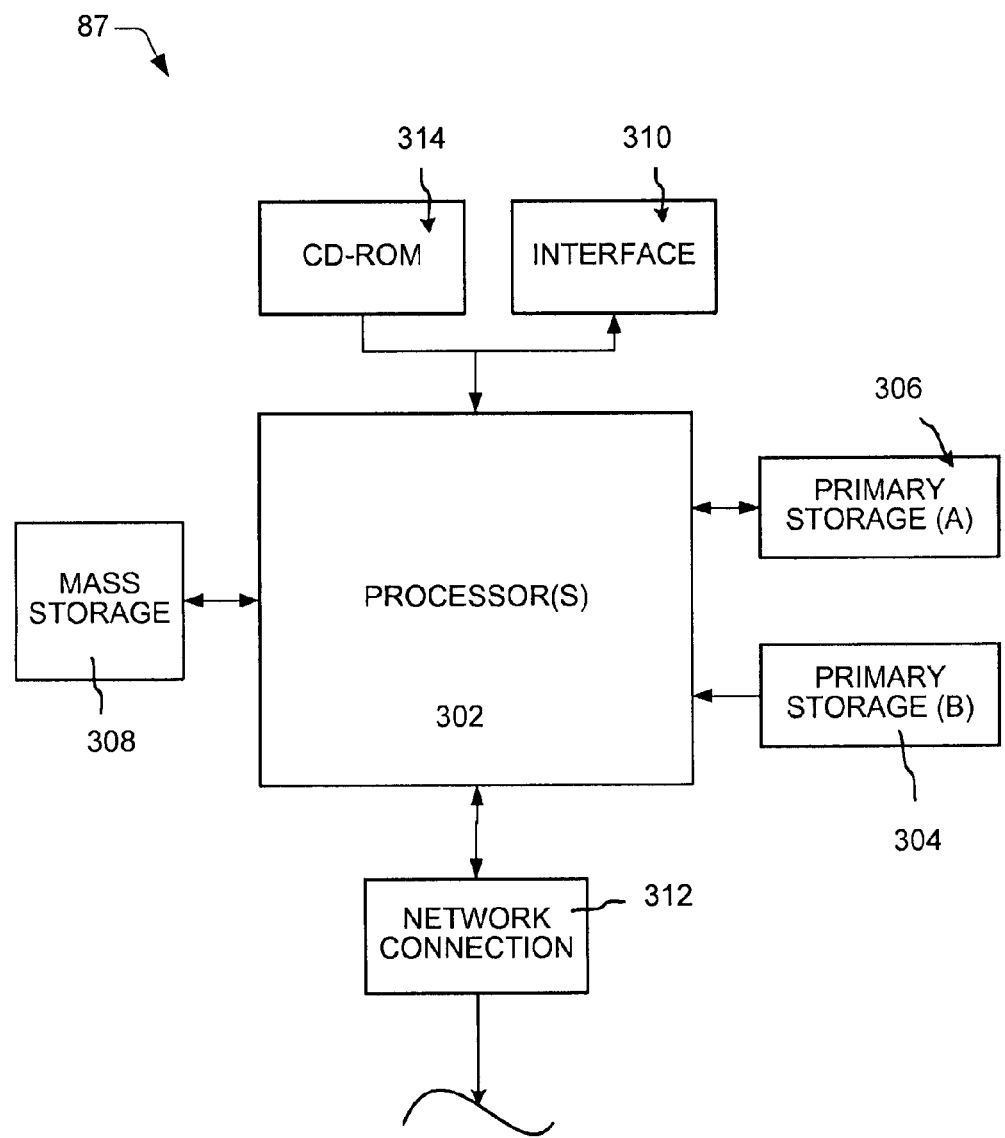
FIG. 7 illustrates an exemplary controller.

Referring now to FIG. 7, illustrates a typical computer system that, when appropriately configured or designed, can serve as the controller 87. The controller 87 includes one or more processors 302 (also referred to as central processing units, or CPUs) that are coupled to storage devices including primary storage 306 (typically a random access memory, or RAM), primary storage 304 (typically a read only memory, or ROM). CPU 302 may be of various types including microcontrollers and microprocessors such as programmable devices (e.g., CPLDs and FPGAs) and other devices such as gate array ASICs or general purpose microprocessors.

Primary storage 304 and 306 acts to transfer data and instructions to and/or from the CPU 302. Both of these primary storage devices may include any suitable computer-readable media. A mass storage device 308 may also be connected to CPU 302 and provide additional data storage capacity and may include any computer-readable media. Mass storage device 308 may be used to store programs, data and the like and is typically a secondary storage medium such as a hard disk. Information retained within the mass storage device 308, may, in appropriate cases, be incorporated in standard fashion as part of primary storage 306 as virtual memory. A specific mass storage device such as a CD-ROM 314 may also pass data to the CPU 302.

CPU 302 is also coupled to an interface 310 that connects to one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 302 optionally may be coupled to an external device such as a database or a computer or telecommunications network using an external connection as shown generally at 312. With such a connection, it is contemplated that the CPU might receive information from the network, or might output information to the network in the course of performing the method steps described herein.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A method comprising:
   supplying DC power to a target in a physical vapor deposition (PVD) system, wherein the DC power is greater than or equal to 8 kW;
   creating a magnetic field in a chamber of the PVD system;
   setting a radio frequency (RF) bias applied to a pedestal supporting a substrate to be less than or equal to 120V at a predetermined frequency; and
   etching the substrate.

2. The method of claim 1, wherein creating the magnetic field includes:
   arranging N electromagnetic EM coils around the target;
   arranging P EM coils below the target, wherein N and P are integers greater than or equal to 1; and
   producing a magnetic field in the target that is at least 100 Gauss inside of the target, wherein the N EM coils produce a magnetic field that is opposite in polarity to a magnetic field produced by the P EM coils.

3. The method of claim 2, wherein the N EM coils and the P EM coils create a magnetic cusp.

4. The method of claim 1, wherein the magnetic field is created by permanent magnets arranged around and below the target.

5. The method of claim 4, wherein the permanent magnets create a magnetic cusp.

6. The method of claim 1, wherein the predetermined frequency is 13.65 MHz.

7. The method of claim 1, wherein the DC power is greater than or equal to 10 kW.

8. The method of claim 1, wherein an etch to deposition (E/D) ratio during etching is greater than or equal to 2.

9. The method of claim 8, wherein the E/D ratio during etching is greater than or equal to 3.

10. The method of claim 1, wherein the RF bias is less than 100 V at the predetermined frequency.

11. The method of claim 1, wherein the etching of the substrate includes etching a seed layer arranged on the substrate.

12. The method of claim 11, wherein the seed layer is arranged in at least one of a via and a trench.

13. The method of claim 1, wherein the etching of the substrate includes etching a diffusion barrier layer arranged on the substrate.

14. The method of claim 13, where in the diffusion barrier layer is arranged in at least one of a via and a trench.

15. The method of claim 1, wherein the target is dome shaped.

16. The method of claim 1, wherein the target is cylinder shaped.

17. The method of claim 1, wherein the target is cone frustum shaped.

18. The method of claim 1, further comprising:
   at least one of before and after the etching,
      applying photoresist to the substrate;
      exposing the photoresist to light;
      patterning the photoresist and transferring the pattern to the substrate; and
      selectively removing the photoresist from the substrate.

* * * * *

UNITED STATES PATENT AND TRADEMARK OFFICE
CERTIFICATE OF CORRECTION

PATENT NO. : 8,431,033 B2
APPLICATION NO. : 12/974630
DATED : April 30, 2013
INVENTOR(S) : Zhou et al.

It is certified that error appears in the above-identified patent and that said Letters Patent is hereby corrected as shown below:

In the Specification

Col. 1, Line 47, After "ratio", insert --is--

Col. 1, Line 67, After "via", insert --resistance (Rc)--

Col. 3, Line 48, Delete "disclosure" and insert --disclosure;--

Col. 4, Line 18, After "system", insert --10--

Col. 9, Line 12, After "devices", delete "such as"

Signed and Sealed this
First Day of October, 2013

Teresa Stanek Rea
*Deputy Director of the United States Patent and Trademark Office*